(12) United States Patent
Fu et al.

(10) Patent No.: US 11,750,950 B1
(45) Date of Patent: Sep. 5, 2023

(54) VOLTAGE DOMAIN GLOBAL SHUTTER READOUT CIRCUIT TIMING

(71) Applicant: OMNIVISION TECHNOLOGIES, INC., Santa Clara, CA (US)

(72) Inventors: Ling Fu, Santa Clara, CA (US); Tiejun Dai, Santa Clara, CA (US); Zhe Gao, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/804,238

(22) Filed: May 26, 2022

(51) Int. Cl.
  *H04N 25/75* (2023.01)
  *H01L 27/146* (2006.01)
  *H04N 25/77* (2023.01)
  *H04N 25/531* (2023.01)
  *H04N 25/532* (2023.01)

(52) U.S. Cl.
  CPC ....... *H04N 25/75* (2023.01); *H01L 27/14612* (2013.01); *H04N 25/531* (2023.01); *H04N 25/77* (2023.01)

(58) Field of Classification Search
  CPC ...... H04N 25/75; H04N 25/77; H04N 25/531; H04N 25/532; H01L 27/14612; H01L 27/0285
  See application file for complete search history.

(56) References Cited

U.S. PATENT DOCUMENTS

| | | | |
|---|---|---|---|
| 9,100,605 B2 * | 8/2015 | Raynor | H01L 27/14612 250/208.1 |
| 10,250,832 B1 * | 4/2019 | Xu | H04N 25/778 |
| 11,165,983 B1 | 11/2021 | Park | |
| 11,166,983 B2 * | 11/2021 | Park | H04N 25/75 |
| 2014/0008520 A1 | 1/2014 | Raynor | |
| 2017/0295338 A1 * | 10/2017 | Geurts | H04N 25/771 |
| 2017/0323912 A1 * | 11/2017 | Lahav | H01L 27/14609 |
| 2018/0103226 A1 | 4/2018 | Raynor | |
| 2018/0278875 A1 * | 9/2018 | Rotte | H04N 25/778 |
| 2023/0007192 A1 * | 1/2023 | Lee | H04N 25/531 |
| 2023/0051181 A1 * | 2/2023 | Lalanne | H04N 25/531 |

OTHER PUBLICATIONS

H. Shike et al., "A Global Shutter Wide Dynamic Range Soft X-Ray CMOS Image Sensor With Backside-Illuminated Pinned Photodiode, Two-Stage Lateral Overflow Integration Capacitor, and Voltage Domain Memory Bank," IEEE Transactions on Electron Devices, vol. 68, No. 4, Apr. 2021, 8 pages.

* cited by examiner

*Primary Examiner* — Marly S Camargo
(74) *Attorney, Agent, or Firm* — Perkins Coie LLP

(57) ABSTRACT

A global shutter readout circuit includes a pixel enable signal and a first sample and hold (SH) signal that are configured to turn ON a pixel enable transistor and a first storage transistor at a first time during a global transfer period. The pixel enable signal is configured to begin a transition to an OFF level at a second time and complete the transition to the OFF level at a third time to turn OFF the pixel enable transistor. The first SH signal is configured to begin a transition to the OFF level at a fourth time, which occurs after the second and third times, and complete the transition to the OFF level at a fifth time to turn OFF the first storage transistor. An OFF transition duration between the fourth and fifth times is greater than an ON transition duration of the first SH signal at the first time.

24 Claims, 4 Drawing Sheets

VOLTAGE DOMAIN GLOBAL SHUTTER READOUT CIRCUIT TIMING

BACKGROUND INFORMATION

Field of the Disclosure

This disclosure relates generally to image sensors, and in particular but not exclusively, relates to a global shutter readout circuit for use in reading out image data from an image sensor.

Background

Image sensors have become ubiquitous. They are widely used in digital still cameras, cellular phones, security cameras, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. Correlated double sampling (CDS) is a technique that is used with CMOS image sensors (CIS) to reduce noise from images read out from image sensors by sampling image data from the image sensors and removing undesired offsets sampled from reset value readings from the image sensors. In global shutter CIS design, sample and hold switches are used to sample and hold signal (SHS) readings, as well as sample and hold reset (SHR) readings from the image sensors. The SHR and SHS switches in the sample and hold circuitry are controlled to sample the reset levels and the signal levels from the image sensor. After the global sampling is completed, a readout from the image sensor is performed to digitize the sampled reset and signal levels. The digitized difference between the reset and signal levels are used in the CDS calculation to recover the true image signals.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
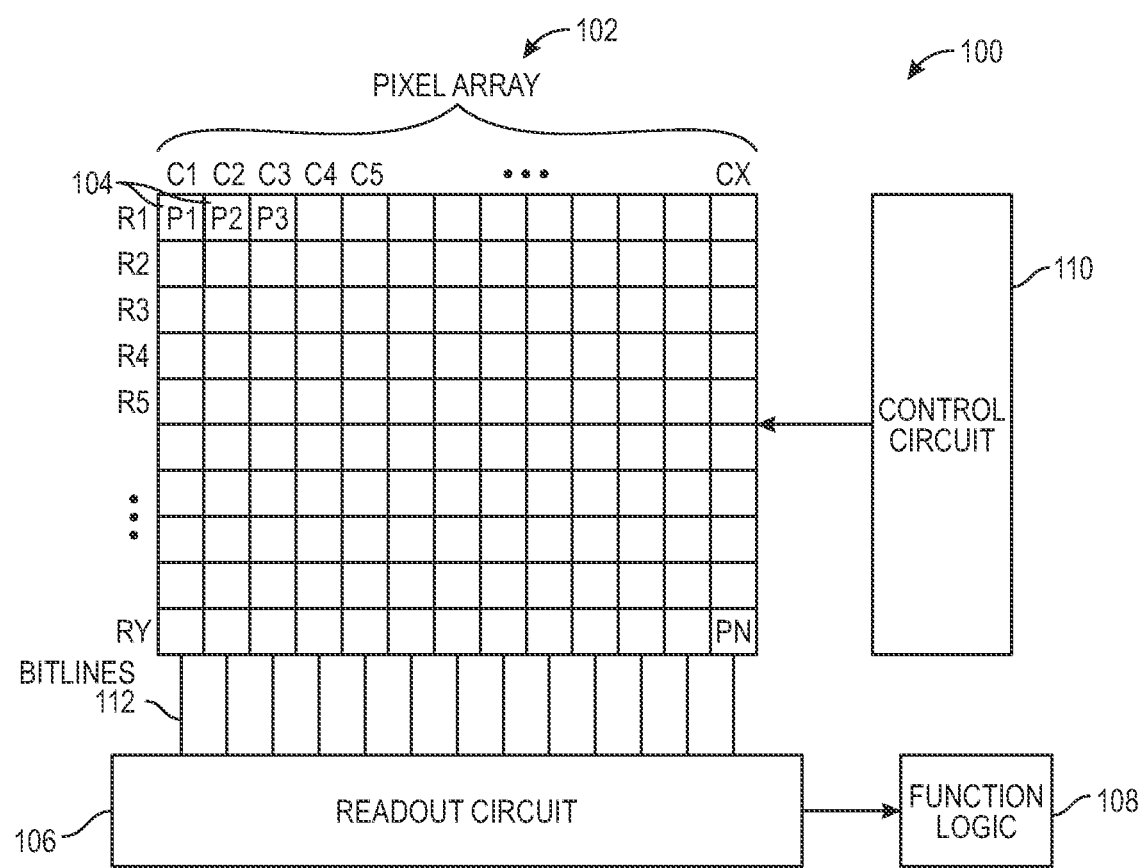
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to voltage domain global shutter readout circuit timing are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In the various examples described below, examples of improved voltage domain global readout circuit timing are disclosed. In the various examples, readouts of the global readout circuits have improved shading performance as well as improved fixed pattern noise performance. As will be described in the various examples, the pixel enable transistor is turned OFF before the sample and hold reset transistor or the sample and hold signal transistor are turned OFF, which enables the bitline voltage in the example global shutter readout circuit to be first sampled at the floating diffusion without coupling mismatch. When it is time to turn OFF the sample and hold reset transistor or the sample and hold signal transistor, the floating diffusion voltage in the global shutter readout circuit is sampled at first and second storage capacitors without mismatch coupling influence from the sample and hold reset transistor or the sample and hold signal transistor to the bias voltage Vb in accordance with the teachings of the present invention. In another example, the pixel enable transistor may also be turned OFF with slope control, changes in the sampled black (e.g., noise) and signal levels have reduced changes or variability from left to right in the pixel array in accordance with the teachings of the present invention.

To illustrate, FIG. 1 shows one example of an imaging system 100 having a pixel array with pixel circuits that are readout through voltage domain global shutter readout circuits with improved timing in accordance with the teachings of the present invention. In particular, the example depicted in FIG. 1 illustrates an imaging system 100 that includes a pixel array 102, bitlines 112, a control circuit 110, a readout circuit 106, and function logic 108. In various examples, imaging system may be implemented as a CMOS image sensor (CIS), which in one example may be in a stacked chipped scheme that includes a pixel die stacked with a logic die or application specific integrated circuit (ASIC) die. In one example, the pixel die may include a pixel array 102, and the ASIC die may include readout circuitry with global shutter readout circuits in accordance with the teachings of the present invention that are coupled to the pixel array 102 through bitlines 112 included in pixel level connections. In one example, the ASIC may also include the control circuit 110 in addition to the readout circuitry 106 as well as the function logic 108.

In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in the one or more photodiodes is transferred to a floating diffusion included in each pixel circuit 104, which may be converted to an image signal, which is then read out from each pixel circuit 104 by readout circuit 106 through bitlines 112. In the various examples, readout circuit 106 may be configured to read out the image signals through column bitlines 112. In various examples, readout circuit 106 may include global shutter readout circuits, current sources, routing circuitry, and comparators that may be included in analog to digital converters or otherwise.

In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 104 is coupled to pixel array 102 to control operation of the plurality of photodiodes in pixel array 102. For example, control circuit 104 may generate global shutter signals for controlling image acquisition. In other examples, image acquisition is synchronized with lighting effects such as a flash.

In one example, imaging system 100 may be included in a digital, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
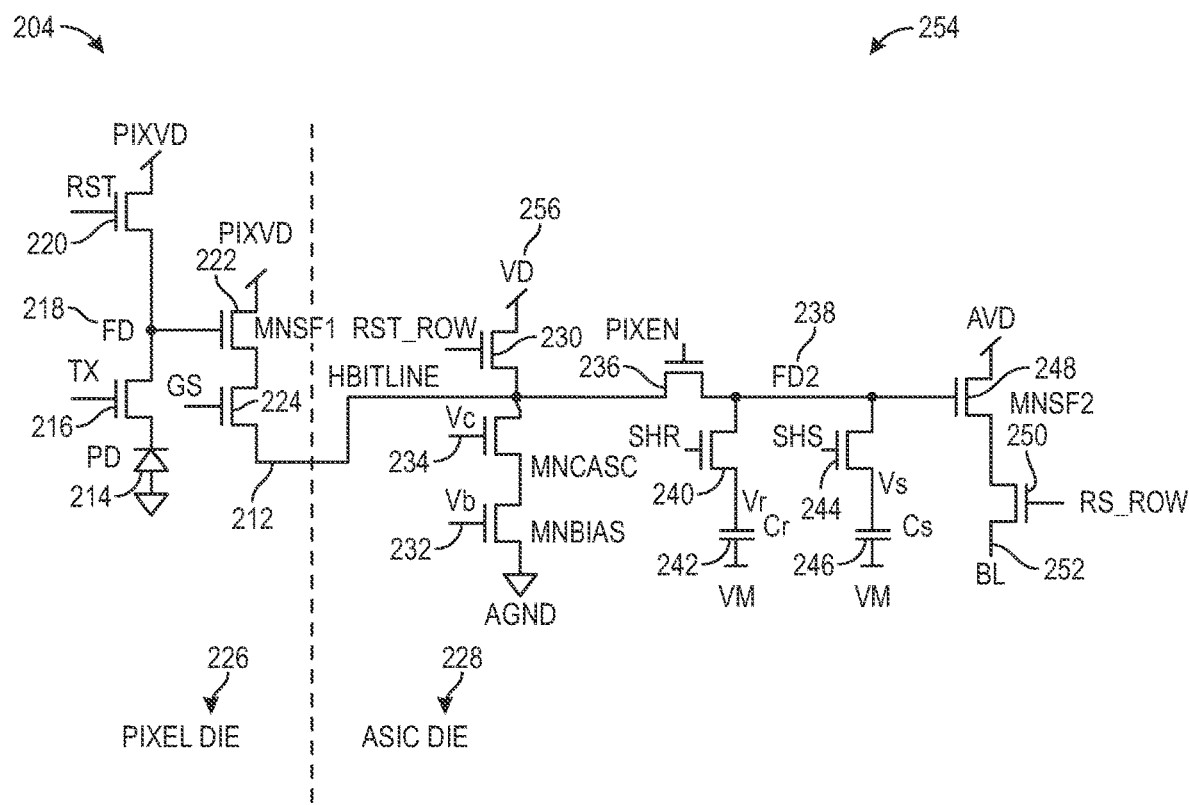
FIG. 2 shows a schematic of an example of a pixel circuit and a voltage domain global shutter readout circuit in an image sensor in accordance with the teachings of the present invention.

FIG. 2 shows a schematic of an example of pixel circuit 204 and an example of global shutter readout circuit 254 in an image sensor in accordance with the teachings of the present invention. It is noted that pixel circuit 204 of FIG. 2 may be an example of one of the pixel circuits 104 described in FIG. 1, and that similarly named and numbered elements referenced below are coupled and function similar to as described above.

As shown in the example depicted in FIG. 2, the pixel circuit 204 may be included in a pixel die 226 and the global shutter readout circuit 254 may be included in a readout circuit included in an ASIC die 228. In one example, pixel circuit 204 includes a photodiode 214, which is coupled to photogenerate image charge in response to incident light. A transfer transistor 216 is coupled to transfer the photogenerated image charge from the photodiode 214 to a floating diffusion 218 in response to a transfer signal TX. A reset transistor 220 is coupled to a pixel voltage supply (e.g., PIXVD) to reset the floating diffusion 218 in response to a reset signal RST. The gate of a source follower transistor 222 is coupled to convert the charge in the floating diffusion 218 to an image data signal, which is coupled to be output through a row select transistor 224 through a bitline 212 in response to a row select signal GS. In an imaging system that utilizes correlated double sampling (CDS), the charge on the floating diffusion 218 is also read out through bitline 212 after a floating diffusion reset operation to obtain a reset level, and the charge on the floating diffusion 218 is also read out through bitline 212 after the image charge is transferred to the floating diffusion 218 to obtain a signal level.

Continuing with the depicted example, the global shutter readout circuit 254 includes a reset transistor 230 coupled between a reset voltage VD 256 and the bitline 212 from pixel circuit 204. In one example, the reset transistor 230 is configured to be controlled in response to a reset row control signal RST_ROW. As shown in the depicted example, a pixel enable transistor 236 includes a first terminal (e.g., a first source/drain terminal) coupled to the bitline 212 and the reset transistor 230. A source follower transistor 248 includes a gate coupled to a second terminal (e.g., a second source/drain terminal) of the pixel enable transistor 236 such that the pixel enable transistor 236 is coupled between the reset transistor 230 and the source follower transistor 248. In one example, the first and second terminals of the pixel enable transistor 236 are coupled together in response to a pixel enable signal PIXEN coupled to a third terminal (e.g., gate) of the pixel enable transistor 236.

As shown in the example shown in FIG. 2, a first storage transistor 240 is coupled to the second terminal of the pixel enable transistor 236 and the gate of the source follower transistor 248. A first storage capacitor 242 is coupled to the first storage transistor 240. As shown, second storage transistor 244 is also coupled to the second terminal of the pixel enable transistor 236 and the gate of the source follower transistor 248. A second storage capacitor 246 is coupled to the second storage transistor 244. As shown in the depicted example, the first storage transistor 240 is configured to be controlled in response to a sample and hold reset control signal SHR and the second storage transistor 244 is configured to be controlled in response to a sample and hold signal control signal SHS.

In the example, a row select transistor 250 is coupled to the source follower transistor 248 such that the source follower transistor 248 and the row select transistor 250 are coupled between a voltage supply (e.g., AVD) and an output 252 of the global shutter readout circuit 254. In operation, the row select transistor 250 is coupled to the source follower transistor 248 to generate an output signal on an output 252 from the global shutter readout circuit 254. As shown in the depicted example, the row select transistor 250 is configured to be controlled in response to a row select row signal RS_ROW.

In the illustrated example, a floating diffusion 238 is coupled to the second terminal of the pixel enable transistor 236, the gate of the source follower transistor 248, the first storage transistor 240, and the second storage transistor 244 as shown. As such, the first storage transistor 240 and the first storage capacitor 242 are coupled between the floating diffusion 238 and a reference voltage (e.g., VM). Similarly, the second storage transistor 244 and the second storage capacitor 246 are coupled between the floating diffusion 238 and the reference voltage VM.

In the example depicted in FIG. 2, global shutter readout circuit 254 also includes a bias transistor 232 coupled between the first terminal of the pixel enable transistor 236 and ground (e.g., AGND). In the example, a cascode transistor 234 is coupled between the first terminal of the pixel enable transistor 236 and the bias transistor 232. In one example, a gate of the bias transistor 232 is coupled to a first bias voltage Vb and a gate of the cascode transistor 234 is coupled to a second bias voltage Vc.

Figure 3:
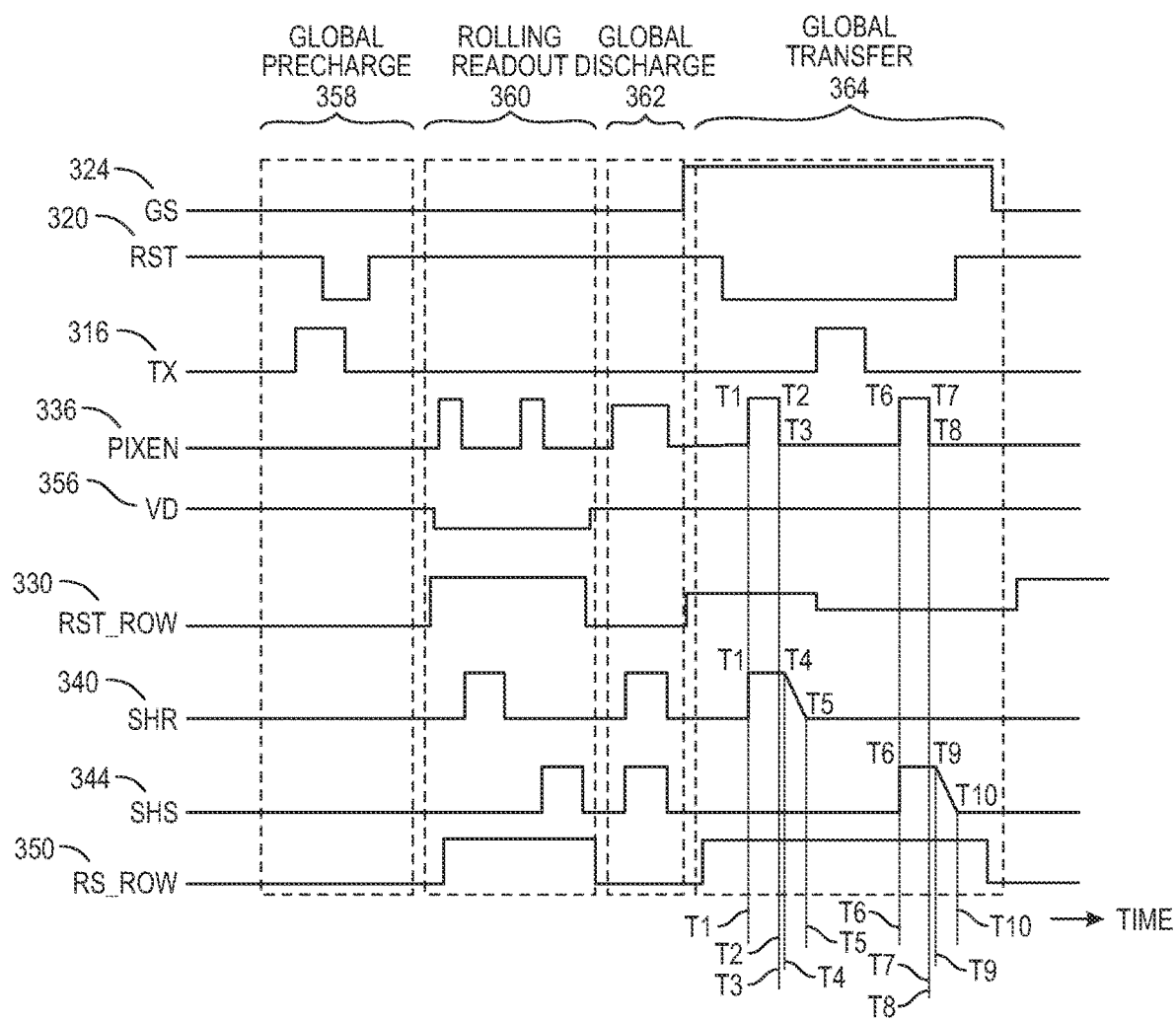
FIG. 3 illustrates an example timing diagram of signal values in an example pixel circuit and voltage domain global shutter readout circuit in accordance with the teachings of the present disclosure.

FIG. 3 illustrates an example timing diagram of signal values in an example pixel circuit and voltage domain global shutter readout circuit in accordance with the teachings of the present disclosure. It is appreciated that the signals depicted in FIG. 3 may be examples of the signals depicted in the pixel circuit 204 and global shutter readout circuit 254 shown in FIG. 2, and that similarly named and numbered elements described above are coupled and function similarly below.

Referring now to the depicted example, FIG. 3 illustrates a row select signal GS 324, a reset signal RST 320, a transfer signal TX 316, a pixel enable signal PIXEN 336, a reset voltage VD 356, a reset row control signal RST_ROW 330, a sample and hold reset control signal SHR 340, a sample and hold signal control signal SHS 344, and a row select row signal RS_ROW 350 during a readout of a pixel circuit 204 by a global shutter readout circuit 254. As shown in the depicted example, the readout of the pixel circuit 204 by the global shutter readout circuit 254 includes a global precharge period 358, followed by a rolling readout period 360, followed by a global discharge period 362, followed by a global transfer period 364.

During the global precharge period 358, it is noted that the row select signal GS 324, the pixel enable signal PIXEN 336, the sample and hold reset control signal SHR 340, and the sample and hold signal control signal SHS 344 are all zero or OFF, and that the reset voltage VD 356 is a constant voltage (e.g., AVDD). In the depicted example, during the global precharge period 358, the reset signal RST 320 is initially ON and then the transfer signal TX 316 is transitions from OFF to ON, at which time the photodiode 214 and floating diffusion 218 are reset. Next, the reset signal RST 320 transitions to OFF and then the transfer signal TX 316 transitions to OFF, after which time the reset signal RST 320 transitions back ON.

Next, during the rolling readout period 360, it is noted that the row select signal GS 324 and the transfer signal TX 316 are both zero or OFF, and that the reset signal RST 320 is one or ON. As shown during the rolling readout period 360, the reset voltage VD 356 changes from the constant voltage (e.g., AVDD) to a lower voltage (e.g., Vblk) that is close to the black level, and the reset row control signal RST_ROW 330 turns ON, which turns ON the reset transistor 230 in the global shutter readout circuit 254. Next, the row select row signal RS_ROW 350 turns ON and the pixel enable signal PIXEN 336 turns ON and then OFF. Next the sample and hold reset control signal SHR 340 turns ON and then OFF. Next, the pixel enable signal PIXEN 336 turns ON and then OFF again, and then the sample and hold signal control signal SHS 344 turns ON and then OFF.

Next, during the global discharge period 362, it is noted that the row select signal GS 324, the transfer signal TX 316, reset row control signal RST_ROW 330, and the row select row signal RS_ROW 350 are all zero or OFF, that the reset signal RST 320 is one or ON, and that the reset voltage VD 356 is the constant voltage (e.g., AVDD). As shown during the global discharge period 362, the pixel enable signal PIXEN 336 turns ON and then the sample and hold reset control signal SHR 340 and the sample and hold signal control signal SHS 344 both turn ON and then OFF. Next, the pixel enable signal PIXEN 336 then turns OFF.

Next, as shown in the global transfer period 364, the row select signal GS 324 transitions to a one or ON, the reset row control signal RST_ROW 330 increases from the previous zero or OFF value. In one example, the reset row control signal RST_ROW 330 changes to a value for black level clamp at the beginning of the global transfer period 364. Next, the row select row signal RS_ROW 350 transitions to a one or ON value. Next, the reset signal RST 320 transitions to a zero or OFF value.

Next, the pixel enable signal PIXEN 336 is configured to transition to an ON level to turn ON the pixel enable transistor 236 at a first time T1 during the global transfer period 364. As shown in the example, the sample and hold reset control signal SHR 340 is also configured to transition to the ON level to turn ON the first storage transistor 240 at the first time T1. Next, the pixel enable signal PIXEN 336 is configured to begin a transition to an OFF level at a second time T2. As shown in the depicted example, pixel enable signal PIXEN 336 is configured to complete the transition to the OFF level at a third time T3 to turn OFF the pixel enable transistor 236. It is appreciated that time T3 occurs after time T2 and that time T2 occurs after time T1. In the example depicted in FIG. 3, it is appreciated that there is substantially no delay between second time T2 and the third time T3 for the pixel enable signal PIXEN 336 to complete the transition from the ON level to the OFF level.

Next, the sample and hold reset control signal SHR 340 is configured to begin a transition to the OFF level at a fourth time T4. It is appreciated that the fourth time T4 occurs after the second and third times T2 and T3. As shown in the depicted example, the sample and hold reset control signal SHR 340 is configured to complete the transition to the OFF level at a fifth time T5 to turn OFF the first storage transistor 240. At this time, the reset level is sampled and held in the first storage transistor 242. In the depicted example, the sample and hold reset control signal SHR 340 transitions from the ON level to the OFF level with slope control such the fifth time T5 occurs after the fourth time T4 and that an OFF transition duration between the fourth and fifth times T4 and T5 is greater than an ON transition duration of the sample and hold reset control signal SHR 340 transitioning from the OFF level to the ON level at the first time T1. In one example, the sample and hold reset control signal SHR 340 transitioning from the ON level to the OFF level with slope control between the fourth time T4 and the fifth time T5 may be realized with a slope control circuit that controls the slope of the falling voltage of the sample and hold reset control signal SHR 340.

Next, after the fifth time T5, the transfer signal TX 316 transitions to an ON value. As such, image charge in the photodiode 214 is transferred to the floating diffusion. In one example, the reset row control signal RST_ROW 330 transitions to a signal clamp value at this time. Next, the transfer signal TX 316 transitions to an OFF value.

Next, after the transfer signal TX 316 transitions to the OFF value during the global transfer period 364, the pixel enable signal PIXEN 336 is configured to transition to the ON level to turn ON the pixel enable transistor 236 at a sixth time T6 and the sample and hold signal control signal SHS 344 is configured to transition to the ON level to turn ON the second storage transistor 244 at the sixth time T6. It is appreciated that the sixth time T6 occurs after the fifth time T5 and after the transfer signal TX 316 transitions to the OFF value.

Next, the pixel enable signal PIXEN 336 is configured to begin a transition to the OFF level at a seventh time and then the pixel enable signal PIXEN 336 is configured to complete the transition to the OFF level at an eighth time T8 to turn OFF the pixel enable transistor 236. It is appreciated that the seventh and eighth times T7 and T8 occur after the sixth time. In the example depicted in FIG. 3, it is appreciated that there is substantially no delay between seventh time T7 and the eighth time T8 for the pixel enable signal PIXEN 336 to complete the transition from the ON level to the OFF level.

Next, the sample and hold signal control signal SHS 344 is configured to begin a transition to the OFF level at a ninth time T9. It is appreciated that the ninth time T9 occurs after the seventh and eighth times T7 and T8. In the example, the sample and hold signal control signal SHS 344 is configured to complete the transition to the OFF level at a tenth time T10 to turn OFF the second storage transistor 244. At this time, it is appreciated that a signal value is sampled and held in the second storage transistor 244. In the depicted example, the sample and hold signal control signal SHS 344 transitions from the ON level to the OFF level with slope control such the tenth time T10 occurs after the ninth time T9 and that the OFF transition duration between the ninth and tenth times T9 and T10 is greater than an ON transition duration of the sample and hold signal control signal SHS 344 transitioning from the OFF level to the ON level at the sixth time T6. In one example, the sample and hold signal control signal SHS 344 transitioning from the ON level to the OFF level with slope control between the ninth time T9 and the tenth time T10 may be realized with a slope control circuit that controls the slope of the falling voltage of the sample and hold signal control signal SHS 344.

Next, the reset signal RST 320 transitions to an ON value, and then the row select row signal RS_ROW 350 transitions to an OFF value and then the row select signal GS 324 transitions to an OFF value.

Figure 4:
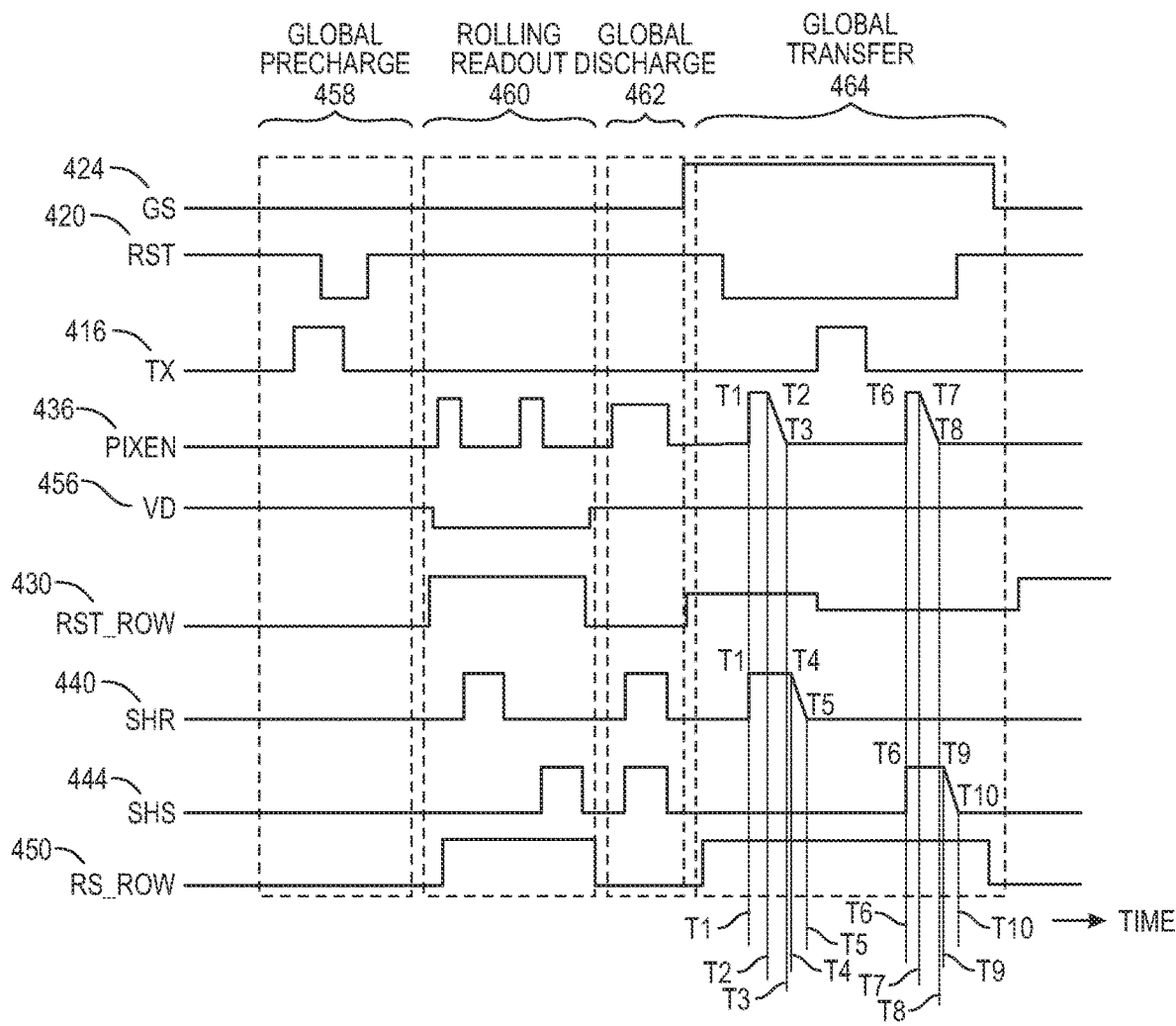
FIG. 4 illustrates another example timing diagram of signal values in an example pixel circuit and voltage domain global shutter readout circuit in accordance with the teachings of the present disclosure.

FIG. 4 illustrates another example timing diagram of signal values in an example pixel circuit and voltage domain global shutter readout circuit in accordance with the teachings of the present disclosure. It is appreciated that the signals depicted in FIG. 4 may be additional examples of the signals depicted in the pixel circuit 204 and global shutter readout circuit 254 shown in FIG. 2, and that similarly named and numbered elements described above are coupled and function similarly below. It is further appreciated that the example timing diagram depicted in FIG. 4 shares similarities to the example timing diagram depicted in FIG. 3.

For instance, FIG. 4, illustrates a row select signal GS 424, a reset signal RST 420, a transfer signal TX 416, a pixel enable signal PIXEN 436, a reset voltage VD 456, a reset row control signal RST_ROW 430, a sample and hold reset control signal SHR 440, a sample and hold signal control signal SHS 444, and a row select row signal RS_ROW 450 during a readout of a pixel circuit 204 by a global shutter readout circuit 254. As shown in the depicted example, the readout of the pixel circuit 204 by the global shutter readout circuit 254 includes a global precharge period 458, followed by a rolling readout period 460, followed by a global discharge period 462, followed by a global transfer period 464.

During the global precharge period 458, it is noted that the row select signal GS 424, the pixel enable signal PIXEN 436, the sample and hold reset control signal SHR 440, and the sample and hold signal control signal SHS 444 are all zero or OFF, and that the reset voltage VD 456 is a constant voltage (e.g., AVDD). In the depicted example, during the global precharge period 458, the reset signal RST 420 is initially ON and then the transfer signal TX 416 is transitions from OFF to ON, at which time the photodiode 214 and floating diffusion 218 are reset. Next, the reset signal RST 420 transitions to OFF and then the transfer signal TX 416 transitions to OFF, after which time the reset signal RST 420 transitions back ON.

Next, during the rolling readout period 460, it is noted that the row select signal GS 424 and the transfer signal TX 416 are both zero or OFF, and that the reset signal RST 420 is one or ON. As shown during the rolling readout period 460, the reset voltage VD 456 changes from the constant voltage (e.g., AVDD) to a lower voltage (e.g., Vblk) that is close to the black level, and the reset row control signal RST_ROW 430 turns ON, which turns ON the reset transistor 230 in the global shutter readout circuit 254. Next, the row select row signal RS_ROW 450 turns ON and the pixel enable signal PIXEN 436 turns ON and then OFF. Next the sample and hold reset control signal SHR 440 turns ON and then OFF. Next, the pixel enable signal PIXEN 436 turns ON and then OFF again, and then the sample and hold signal control signal SHS 444 turns ON and then OFF.

Next, during the global discharge period 462, it is noted that the row select signal GS 424, the transfer signal TX 416, reset row control signal RST_ROW 430, and the row select row signal RS_ROW 450 are all zero or OFF, that the reset signal RST 420 is one or ON, and that the voltage VD 456 is the constant voltage (e.g., AVDD). As shown during the global discharge period 462, the pixel enable signal PIXEN 436 turns ON and then the sample and hold reset control signal SHR 440 and the sample and hold signal control signal SHS 444 both turn ON and then OFF. Next, the pixel enable signal PIXEN 436 then turns OFF.

Next, as shown in the global transfer period 464, the row select signal GS 424 transitions to a one or ON, the reset row control signal RST_ROW 430 increases from the previous zero or OFF value. In one example, the reset row control signal RST_ROW 430 increases to a black clamp value at the beginning of the global transfer period 464. Next, the row select row signal RS_ROW 450 transitions to a one or ON value. Next, the reset signal RST 420 transitions to a zero or OFF value.

Next, the pixel enable signal PIXEN 436 is configured to transition to an ON level to turn ON the pixel enable transistor 236 at a first time T1 during the global transfer period 464. As shown in the example, the sample and hold reset control signal SHR 440 is also configured to transition to the ON level to turn ON the first storage transistor 240 at the first time T1. Next, the pixel enable signal PIXEN 436 is configured to begin a transition to an OFF level at a second time T2. As shown in the depicted example, pixel enable signal PIXEN 436 is configured to complete the transition to the OFF level at a third time T3 to turn OFF the pixel enable transistor 236.

In the depicted example, the pixel enable signal PIXEN 436 transitions from the ON level to the OFF level with slope control such the third time T3 occurs after the second time T2 and that an OFF transition duration between the second and third times T2 and T3 is greater than an ON transition duration of the pixel enable signal PIXEN 436 transitioning from the OFF level to the ON level at the first time T1. In one example, the pixel enable signal PIXEN 436 transitioning from the ON level to the OFF level with slope control between the second time T2 and the third time T3 may be realized with a slope control circuit that controls the slope of the falling voltage of the pixel enable signal PIXEN 436.

Next, the sample and hold reset control signal SHR 440 is configured to begin a transition to the OFF level at a fourth time T4. It is appreciated that the fourth time T4 occurs after the second and third times T2 and T3. As shown in the depicted example, the sample and hold reset control signal SHR 440 is configured to complete the transition to the OFF level at a fifth time T5 to turn OFF the first storage transistor 240. At this time, the reset level is sampled and held in the first storage transistor 242. In the depicted example, the sample and hold reset control signal SHR 440 transitions from the ON level to the OFF level with slope control such the fifth time T5 occurs after the fourth time T4 and that an OFF transition duration between the fourth and fifth times T4 and T5 is greater than an ON transition duration of the sample and hold reset control signal SHR 440 transitioning from the OFF level to the ON level at the first time T1. In one example, the sample and hold reset control signal SHR 440 transitioning from the ON level to the OFF level with slope control between the fourth time T4 and the fifth time T5 may be realized with a slope control circuit that controls the slope of the falling voltage of the sample and hold reset control signal SHR 440.

Next, after the fifth time T5, the transfer signal TX 416 transitions to an ON value. As such, image charge in the photodiode 214 is transferred to the floating diffusion. In one example, the reset row control signal RST_ROW 430 transitions to a signal clamp value. Next, the transfer signal TX 416 transitions to an OFF value.

Next, after the transfer signal TX 416 transitions to the OFF value during the global transfer period 464, the pixel enable signal PIXEN 436 is configured to transition to the ON level to turn ON the pixel enable transistor 236 at a sixth time T6 and the sample and hold signal control signal SHS 444 is configured to transition to the ON level to turn ON the second storage transistor 244 at the sixth time T6. It is appreciated that the sixth time T6 occurs after the fifth time T5 and after the transfer signal TX 416 transitions to the OFF value.

Next, the pixel enable signal PIXEN 436 is configured to begin a transition to the OFF level at a seventh time and then the pixel enable signal PIXEN 436 is configured to complete the transition to the OFF level at an eighth time T8 to turn OFF the pixel enable transistor 236. In the depicted example, the pixel enable signal PIXEN 436 transitions from the ON level to the OFF level with slope control such the eighth time T8 occurs after the seventh time T7 and that an OFF transition duration between the seventh and eighth times T7 and T8 is greater than an ON transition duration of the pixel enable signal PIXEN 436 transitioning from the OFF level to the ON level at the sixth time T6. In one example, the pixel enable signal PIXEN 436 transitioning from the ON level to the OFF level with slope control between the seventh time T7 and the eighth time T8 may be realized with a slope control circuit that controls the slope of the falling voltage of the pixel enable signal PIXEN 436.

Next, the sample and hold signal control signal SHS 444 is configured to begin a transition to the OFF level at a ninth time T9. It is appreciated that the ninth time T9 occurs after the seventh and eighth times T7 and T8. In the example, the sample and hold signal control signal SHS 444 is configured to complete the transition to the OFF level at a tenth time T10 to turn OFF the second storage transistor 244. At this time, the signal level is sampled and held in the second storage capacitor 246. In the depicted example, the sample and hold signal control signal SHS 444 transitions from the ON level to the OFF level with slope control such the tenth time T10 occurs after the ninth time T9 and that an OFF transition duration between the ninth and tenth times T9 and T10 is greater than an ON transition duration of the sample and hold signal control signal SHS 444 transitioning from the OFF level to the ON level at the sixth time T6. In one example, the sample and hold signal control signal SHS 444 transitioning from the ON level to the OFF level with slope control between the ninth time T9 and the tenth time T10 may be realized with a slope control circuit that controls the slope of the falling voltage of the sample and hold signal control signal SHS 444.

Next, the reset signal RST 420 transitions to an ON value, and then the row select row signal RS_ROW 450 transitions to an OFF value and then the row select signal GS 424 transitions to an OFF value.

In the various examples described in FIGS. 2-4 above in which the pixel enable signal PIXEN 336/436 is turned OFF before the sample and hold reset control signal SHR 340/440 and the sample and hold signal control signal SHS 344/444 are turned OFF, it is appreciated that shading performance is substantially improved compared to traditional examples in which the pixel enable signal PIXEN 336/436 is not turned OFF before the sample and hold reset control signal SHR 340/440 and the sample and hold signal control signal SHS 344/444 are turned OFF. In the various examples, improvements to shading performance address mismatches in coupling capacitances between the bias voltage Vb and the different locations of the sample and hold reset control signals SHR 340/440 and the sample and hold signal control signals SHS 344/444 across the pixel array (e.g., left to right) by applying slope control when turning off the signals.

For instance, when the pixel enable signal PIXEN 336/346 is turned OFF before turning OFF the sample and hold reset control signals SHR 340/440 and the sample and hold signal control signals SHS 344/444, the bitline 212 voltage is first sampled at the floating diffusion 238 without any coupling mismatch. Then, when it is time to turn OFF the sample and hold reset control signal SHR 340/440 or the sample and hold signal control signal SHS 344/444, the floating diffusion 238 voltage is finally sampled at the first and second storage capacitors 242 and 246 without the influence from the mismatch in coupling from the sample and hold reset control signal SHR 340/440 and the sample and hold signal control signal SHS 344/444 to the bias voltage Vb and others. Furthermore, in the example in which the pixel enable signal PIXEN 336/436 is turned OFF with slope control as described in FIG. 4, the black level/reset and signal voltages have less variance from left to right and from top to bottom in the pixel array.

In addition, it is noted that fixed pattern noise is also improved with the examples described in FIGS. 2-4 above. For instance, in an example in which the pixel enable signal PIXEN 336/436 remains ON during the global transfer period 364/464, the floating diffusion 238 in the global shutter readout circuit 254 therefore remains coupled to the output of source follower transistor 222 in the pixel circuit 204 through the bitline 212 and row select transistor 224. In an example in which the sample and hold reset control signals SHR 340/440 and/or the sample and hold signal control signals SHS 344/444 are turned OFF slowly with slope control, the majority of the sampled and held reset (SHR) and sampled and held signal (SHS) mismatched electrons (e.g., both from coupling and charge injection) will be absorbed by the source follower transistor 222 in the pixel circuit 204 during global transfer. However, during the rolling readout period 360/460, when the sample and hold reset control signals SHR 340/440 and/or the sample and hold signal control signals SHS 344/444 turn on (at different times), the floating diffusion 238 is coupled to one of the first and second storage capacitors 242 or 246, and the SHR and SHS mismatched holes are therefore injected to the first and second storage capacitors 242 or 246 and floating diffusion 238, which cannot be completely canceled with mismatched electrons during the global transfer period 364/464. As a consequence of this inconsistent condition, there is larger fixed pattern noise at the output 252 of the global shutter readout circuit 254.

However, in the examples described above in FIGS. 2-4, the pixel enable signal PIXEN 336/436 is turned OFF before any sample and hold operations with the sample and hold reset control signals SHR 340/440 and/or the sample and hold signal control signals SHS 344/444. As a result, the floating diffusion 238 is floating at the moment when the pixel enable signal PIXEN 336/436 is turned OFF instead of being coupled to and absorbed by the source follower transistor 222. As such, the majority of the SHR and SHS mismatched electrons are instead sampled by the first and second storage capacitors 242 or 246. During the rolling readout period 360/460, the SHR and SHS mismatched holes (which are caused by the sample and hold reset control signals SHR 340/440 and/or the sample and hold signal control signals SHS 344/444 turning ON) are injected into the first and second storage capacitors 242 or 246 and floating diffusion 238 and will mostly cancel with the mismatched electrons that are injected to the first and second storage capacitors 242 or 246, which are caused by the sample and hold reset control signals SHR 340/440 and/or the sample and hold signal control signals SHS 344/444 turning OFF, during the global transfer period 364. Therefore, it is appreciated that the same floating conditions of the floating diffusion 238 when the pixel enable signal PIXEN 336/436 is turned OFF during global transfer help to reduce fixed pattern noise by a larger amount at output 252 of the global shutter readout circuit 254 in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A global shutter readout circuit, comprising:
   a pixel enable transistor having a first terminal coupled to a bitline from a pixel circuit;
   a source follower transistor having a gate coupled to a second terminal of the pixel enable transistor such that the pixel enable transistor is coupled between the bitline and the source follower transistor, wherein the first and second terminals of the pixel enable transistor are coupled together in response to a pixel enable signal coupled to a third terminal of the pixel enable transistor;
   a first storage transistor coupled to the second terminal of the pixel enable transistor and the gate of the source follower transistor;
   a first storage capacitor coupled to the first storage transistor, wherein the first storage capacitor and the gate of the source follower are configured to be coupled together in response to a first sample and hold (SH) signal coupled to a gate of the first storage transistor;
   a second storage transistor coupled to the second terminal of the pixel enable transistor and the gate of the source follower transistor; and
   a second storage capacitor coupled to the second storage transistor, wherein the second storage capacitor and the gate of the source follower are configured to be coupled together in response to a second sample and hold (SH) signal coupled to a gate of the second storage transistor,
   wherein the pixel enable signal is configured to transition to an ON level to turn ON the pixel enable transistor at a first time during a global transfer period, wherein the first SH signal is configured to transition to the ON level to turn ON the first storage transistor at the first time,
   wherein the pixel enable signal is configured to begin a transition to an OFF level at a second time, wherein the pixel enable signal is configured to complete the transition to the OFF level at a third time to turn OFF the pixel enable transistor, wherein the second and third times occur after the first time,
   wherein the first SH signal is configured to begin a transition to the OFF level at a fourth time, wherein the fourth time occurs after the second and third times, wherein the first SH signal is configured to complete the transition to the OFF level at a fifth time to turn OFF the first storage transistor, wherein the first SH signal is configured to transition from the ON level to the OFF level with slope control such that the fifth time occurs after the fourth time and that an OFF transition duration between the fourth and fifth times is greater than an ON transition duration of the first SH signal transitioning from the OFF level to the ON level at the first time.

2. The global shutter readout circuit of claim 1,
   wherein the pixel enable signal is configured to transition to the ON level to turn ON the pixel enable transistor at a sixth time, wherein the second SH signal is configured to transition to the ON level to turn ON the second storage transistor at the sixth time, wherein the sixth time occurs after the fifth time,
   wherein the pixel enable signal is configured to begin a transition to the OFF level at a seventh time, wherein the pixel enable signal is configured to complete the transition to the OFF level at an eighth time to turn OFF the pixel enable transistor, wherein the seventh and eighth times occur after the sixth time,
   wherein the second SH signal is configured to begin a transition to the OFF level at a ninth time, wherein the ninth time occurs after the seventh and eighth times, wherein the second SH signal is configured to complete the transition to the OFF level at a tenth time to turn OFF the second storage transistor, wherein the second SH signal is configured to transition from the ON level to the OFF level with slope control such that the tenth time occurs after the ninth time and that an OFF transition duration between the ninth and tenth times is greater than an ON transition duration of the second SH signal transitioning from the OFF level to the ON level at the sixth time.

3. The global shutter readout circuit of claim 2,
wherein there is substantially no delay between second time and the third time for the pixel enable signal to complete the transition from the ON level to the OFF level,
wherein there is substantially no delay between seventh time and the eighth time for the pixel enable signal to complete the transition from the ON level to the OFF level.

4. The global shutter readout circuit of claim 2,
wherein the pixel enable signal is configured to transition from the ON level to the OFF level with slope control such that an OFF transition duration between the second and third times is greater than an ON transition duration of the pixel enable signal transitioning from the OFF level to the ON level at the first time,
wherein the pixel enable signal is configured to transition from the ON level to the OFF level with slope control such that an OFF transition duration between the seventh and eighth times is greater than an ON transition duration of the pixel enable signal transitioning from the OFF level to the ON level at the sixth time.

5. The global shutter readout circuit of claim 2, further comprising:
a reset transistor coupled between a reset voltage and the bitline; and
a row select transistor coupled to the source follower transistor to generate an output signal from the global shutter readout circuit.

6. The global shutter readout circuit of claim 5, further comprising a floating diffusion, wherein the second terminal of the pixel enable transistor, the gate of the source follower transistor, the first storage transistor, and the second storage transistor are coupled to the floating diffusion.

7. The global shutter readout circuit of claim 6, wherein the first storage transistor and the first storage capacitor are coupled between the floating diffusion and a reference voltage, wherein the second storage transistor and the second storage capacitor are coupled between the floating diffusion and the reference voltage.

8. The global shutter readout circuit of claim 7, further comprising a bias transistor coupled between the first terminal of the pixel enable transistor and ground.

9. The global shutter readout circuit of claim 8, further comprising a cascode transistor coupled between the first terminal of the pixel enable transistor and the bias transistor.

10. The global shutter readout circuit of claim 9, wherein a gate of the bias transistor is coupled to a first bias voltage, wherein a gate of the cascode transistor is coupled to a second bias voltage.

11. The global shutter readout circuit of claim 6, wherein the floating diffusion is configured to be floating and decoupled from the bitline in response to the pixel enable transistor being turned off.

12. The global shutter readout circuit of claim 11, wherein the floating diffusion is configured to be floating and decoupled from the bitline between the fourth and fifth times and between the ninth and tenth times.

13. An imaging system, comprising:
a pixel array including a plurality of pixel circuits;
control circuitry coupled to the pixel array to control operation of the pixel array; and
readout circuitry coupled to the pixel array to read out image data from the pixel array, wherein the readout circuitry includes a plurality of global shutter readout circuits, wherein each global shutter readout circuit comprises:
a pixel enable transistor having a first terminal coupled to a bitline from one of the pixel circuits;
a source follower transistor having a gate coupled to a second terminal of the pixel enable transistor such that the pixel enable transistor is coupled between the bitline and the source follower transistor, wherein the first and second terminals of the pixel enable transistor are coupled together in response to a pixel enable signal coupled to a third terminal of the pixel enable transistor;
a first storage transistor coupled to the second terminal of the pixel enable transistor and the gate of the source follower transistor;
a first storage capacitor coupled to the first storage transistor, wherein the first storage capacitor and the gate of the source follower are configured to be coupled together in response to a first sample and hold (SH) signal coupled to a gate of the first storage transistor;
a second storage transistor coupled to the second terminal of the pixel enable transistor and the gate of the source follower transistor; and
a second storage capacitor coupled to the second storage transistor, wherein the second storage capacitor and the gate of the source follower are configured to be coupled together in response to a second sample and hold (SH) signal coupled to a gate of the second storage transistor,
wherein the pixel enable signal is configured to transition to an ON level to turn ON the pixel enable transistor at a first time during a global transfer period, wherein the first SH signal is configured to transition to the ON level to turn ON the first storage transistor at the first time,
wherein the pixel enable signal is configured to begin a transition to an OFF level at a second time, wherein the pixel enable signal is configured to complete the transition to the OFF level at a third time to turn OFF the pixel enable transistor, wherein the second and third times occur after the first time,
wherein the first SH signal is configured to begin a transition to the OFF level at a fourth time, wherein the fourth time occurs after the second and third times, wherein the first SH signal is configured to complete the transition to the OFF level at a fifth time to turn OFF the first storage transistor, wherein the first SH signal is configured to transition from the ON level to the OFF level with slope control such that the fifth time occurs after the fourth time and that an OFF transition duration between the fourth and fifth times is greater than an ON transition duration of the first SH signal transitioning from the OFF level to the ON level at the first time.

14. The imaging system of claim 13,
wherein the pixel enable signal is configured to transition to the ON level to turn ON the pixel enable transistor at a sixth time, wherein the second SH signal is configured to transition to the ON level to turn ON the second storage transistor at the sixth time, wherein the sixth time occurs after the fifth time,
wherein the pixel enable signal is configured to begin a transition to the OFF level at a seventh time, wherein the pixel enable signal is configured to complete the transition to the OFF level at an eighth time to turn OFF the pixel enable transistor, wherein the seventh and eighth times occur after the sixth time, wherein the second SH signal is configured to begin a transition to the OFF level at a ninth time, wherein the ninth time occurs after the seventh and eighth times, wherein the second SH signal is configured to complete the transition to the OFF level at a tenth time to turn OFF the second storage transistor, wherein the second SH signal is configured to transition from the ON level to the OFF level with slope control such that the tenth time occurs after the ninth time and that an OFF transition duration between the ninth and tenth times is greater than an ON transition duration of the second SH signal transitioning from the OFF level to the ON level at the sixth time.

15. The imaging system of claim 14,
wherein there is substantially no delay between second time and the third time for the pixel enable signal to complete the transition from the ON level to the OFF level,
wherein there is substantially no delay between seventh time and the eighth time for the pixel enable signal to complete the transition from the ON level to the OFF level.

16. The imaging system of claim 14,
wherein the pixel enable signal is configured to transition from the ON level to the OFF level with slope control such that an OFF transition duration between the second and third times is greater than an ON transition duration of the pixel enable signal transitioning from the OFF level to the ON level at the first time,
wherein the pixel enable signal is configured to transition from the ON level to the OFF level with slope control such that an OFF transition duration between the seventh and eighth times is greater than an ON transition duration of the pixel enable signal transitioning from the OFF level to the ON level at the sixth time.

17. The imaging system of claim 14, wherein each global shutter readout circuit further comprises:
 a reset transistor coupled between a reset voltage and the bitline; and
 a row select transistor coupled to the source follower transistor to generate an output signal from the global shutter readout circuit.

18. The imaging system of claim 17, wherein each global shutter readout circuit further comprises a floating diffusion, wherein the second terminal of the pixel enable transistor, the gate of the source follower transistor, the first storage transistor, and the second storage transistor are coupled to the floating diffusion.

19. The imaging system of claim 18, wherein the first storage transistor and the first storage capacitor are coupled between the floating diffusion and a reference voltage, wherein the second storage transistor and the second storage capacitor are coupled between the floating diffusion and the reference voltage.

20. The imaging system of claim 19, wherein each global shutter readout circuit further comprises a bias transistor coupled between the first terminal of the pixel enable transistor and ground.

21. The imaging system of claim 20, wherein each global shutter readout circuit further comprising a cascode transistor coupled between the first terminal of the pixel enable transistor and the bias transistor.

22. The imaging system of claim 21, wherein a gate of the bias transistor is coupled to a first bias voltage, wherein a gate of the cascode transistor is coupled to a second bias voltage.

23. The imaging system of claim 18, wherein the floating diffusion is configured to be floating and decoupled from the bitline in response to the pixel enable transistor being turned off.

24. The imaging system of claim 23, wherein the floating diffusion is configured to be floating and decoupled from the bitline between the fourth and fifth times and between the ninth and tenth times.

* * * * *